United States Patent
Nakagawa et al.

(10) Patent No.: US 7,046,736 B2
(45) Date of Patent: May 16, 2006

(54) METHOD AND APPARATUS FOR MODULATING AND DEMODULATING DATA INTO A VARIABLE-LENGTH CODE AND PROVIDING A SYNC SIGNAL TO THE TRAIN OF CODES

(75) Inventors: Toshiyuki Nakagawa, Kanagawa (JP); Yoshihide Shimpuku, Kanagawa (JP); Tatsuya Narahara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/088,464

(22) Filed: Mar. 24, 2005

(65) Prior Publication Data

US 2005/0168355 A1   Aug. 4, 2005

Related U.S. Application Data

(63) Continuation of application No. 09/530,074, filed as application No. PCT/JP99/04562 on Aug. 24, 1999, now Pat. No. 6,879,637.

(30) Foreign Application Priority Data

Aug. 24, 1998 (JP) ............................... P10-237044

(51) Int. Cl.
 *H04B 14/04* (2006.01)
(52) U.S. Cl. .................. 375/253; 375/365; 375/246; 375/259; 375/295; 341/59; 341/58; 341/67; 341/68; 341/50; 369/59.23; 369/59.25; 714/758; 714/769
(58) Field of Classification Search ................ 375/253, 375/365, 246, 259, 295; 341/59, 58, 67, 341/68, 50; 369/59.23, 59.25; 714/758, 714/769
See application file for complete search history.

(56) References Cited

U.S. PATENT DOCUMENTS

| | | | |
|---|---|---|---|
| 4,817,146 | A | 3/1989 | Szczutkowski et al. |
| 5,151,699 | A | 9/1992 | Moriyama |
| 5,355,133 | A | 10/1994 | Shimpuku et al. |
| 5,365,231 | A | 11/1994 | Niimura |
| 5,400,023 | A | 3/1995 | Ino et al. |
| 5,432,799 | A | 7/1995 | Shimpuku et al. |
| 5,506,581 | A | 4/1996 | Ino et al. |
| 5,523,991 | A | 6/1996 | Mizokami et al. |
| 5,528,236 | A | 6/1996 | Shimpuku et al. |
| 5,572,506 | A | 11/1996 | Aoki |

(Continued)

FOREIGN PATENT DOCUMENTS

EP      0 577 402      1/1994

(Continued)

*Primary Examiner*—Chieh M. Fan
*Assistant Examiner*—Sudhanshu C. Pathak
(74) *Attorney, Agent, or Firm*—Frommer Lawrence & Haug LLP; William S. Frommer; Thomas F. Presson

(57) ABSTRACT

A data-demodulating apparatus for demodulating a variable-length code (d, k; m, n; r) having a basic code length of n bits to data having a basic data length of m bits. A train of codes is received, and a sync signal having a pattern that breaks a maximum run is detected. The pattern is repeated twice continuously and the minimum run is repeated no more than six times. The first bit of the sync signal is "1" when the train of modulated codes that immediately precedes the sync signal is included in a termination table used to terminate, at a desired position, a code when less than a predetermined number of variable length codes are available.

1 Claim, 3 Drawing Sheets

U.S. PATENT DOCUMENTS

| | | |
|---|---|---|
| 5,615,056 A | 3/1997 | Oguro |
| 5,623,474 A | 4/1997 | Oshio et al. |
| 5,781,131 A | 7/1998 | Shimpuku et al. |
| 5,821,883 A | 10/1998 | Chiba et al. |
| 6,172,622 B1 * | 1/2001 | Nakagawa et al. ............ 341/59 |
| 6,340,938 B1 * | 1/2002 | Nakagawa .................... 341/58 |
| 6,369,724 B1 * | 4/2002 | Nakagawa .................... 341/59 |
| 6,879,637 B1 * | 4/2005 | Nakagawa et al. ......... 375/253 |

FOREIGN PATENT DOCUMENTS

| | | |
|---|---|---|
| EP | 0 597 443 | 5/1994 |
| EP | 0 605 206 | 7/1994 |
| EP | 0 660 325 | 6/1995 |
| EP | 0 779 623 | 6/1997 |
| JP | 62-272726 | 11/1987 |
| JP | 9-162857 | 6/1997 |

* cited by examiner

METHOD AND APPARATUS FOR MODULATING AND DEMODULATING DATA INTO A VARIABLE-LENGTH CODE AND PROVIDING A SYNC SIGNAL TO THE TRAIN OF CODES

CROSS-REFERENCES TO RELATED APPLICATIONS

This application is a continuation of application Ser. No. 09/530,074, filed Jun. 26, 2000, now U.S. Pat. No. 6,879,637, which is an application filed under 35 USC371 of International Application PCT/JP99/04562, filed Aug. 24, 1999, the entirety of which is incorporated herein by reference.

TECHNICAL FIELD

The present invention relates to a modulation a data-modulating apparatus, a data-modulating method, a data-demodulating apparatus, a data-demodulating method, and a data-providing medium. Particularly, the invention relates to an apparatus and method for modulating data to transmit the data or record the data on a recording medium, an apparatus and method for demodulating data that has been modulated, and a medium for use in transmitting or recording data that has been modulated.

BACKGROUND ART

Data to be transmitted via a predetermined transmission path or recorded on a recording medium such as, for example, a magnetic disk, an optical disk or a magneto-optical disk, is modulated. Block encoding is known as one of such data-modulating methods. In block encoding, a row of data is divided into blocks, or units each consisting of m×i bits. (Hereinafter, the units of data will be referred to as "data words.") The data words are modulated to code words, each consisting of n×i bits, in accordance with an appropriate encoding rule. Each code word has a fixed length if i is one (1) and has a variable length if i is selected from a plurality of values. That is, the code word has a variable length when a value ranging from 1 to imax (the greatest value for i) is selected for i. The code generated by the block encoding is a variable-length code (d, k; m, n; r).

It should be noted that the value i is called "constraint length", and the value imax is called "maximum" constraint length r. The minimum run d indicates the least number of ones (1s) that may be included in a train of codes. The maximum run k indicates the greatest number of ones (1s) that may be included in a train of codes.

To record variable-length codes generated as described above, on a compact disk, a mini-disk or the like, NRZI (NonReturn to Zero Inverted) modulation is used. In the NRZI modulation, the variable-length code is inverted at each one (1) and not inverted at each zero (0). The variable-length codes subjected to the NRZI modulation (hereinafter referred to as "level codes") are recorded on the disk.

Inverse NRZI modulation, wherein a level code is changed when a "1" is inverted to "0" or "0" is inverted to "1", thereby becoming an edge, may be performed on variable-length codes. In this case, a train of codes identical to original EFM codes or RLL (1–7) codes can be obtained. These inverse NRZI codes are called "edge codes."

Let the minimum interval of inverting level codes be Tmin, and let the maximum interval of inverting level codes be Tmax. In order to record data at high density in the linear velocity direction, it is desired that the minimum code-inverting interval Tmin be long. That is, the minimum run d should be large. In order to reproduce clock signals, it is desired that the maximum code-inverting interval Tmax be short. In other words, the maximum run k should be small. In view of this, various data-modulating methods are proposed.

One example is the data-modulating method know as RLL (1–7) that is used to record data on a magnetic disk, a magneto-optical disk or the like. The parameter for this data-modulating method is (1,7,2,3; 2). The minimum code-inverting interval Tmin is 2T, or (1+1)T. This minimum code-inverting interval Tmin is 1.33Tdata, i.e., (m/n)× Tmin=(⅔)×2. The maximum code-inverting period Tmax, given as (k+1)T, is 8, or (7+1)T=⅔×8Tdata=5.33Tdata. The width Tw of the detection window, given as (m/n)T, is 0.67 (=⅔) Tdata.

The conversion table for RLL (1–7) codes is, for example, a table shown in the following Table 1:

TABLE 1

RLL (1, 7; 2, 3; 2)

| | Data | Decode |
|---|---|---|
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |

Symbol x used in the conversion table is "1" when the next channel bit is "0" and is "0" when the next channel bit is "1". The maximum constraint length r is 2.

In the train of channel bits, which has been modulated by the method RLL (1–7), 2T occurs most frequently at interval Tmin, 3Tmin, 3T occurs less frequently than 2T, and 4T occurs less frequently than 3T. If edge data items such as 2T or 3T occur at high frequency, it helps to reproduce clock signals. If 2T occurs continuously, however, its recorded waveform may likely be deformed. (The waveform output of 2T is small and is easily influenced by either defocusing or tangential tilt.) Further, the smallest marks recorded continuously in high linear density may likely be influenced by external disturbance such as noise, causing errors in the data that will be reproduced.

It has been proposed in Japanese Patent Application No. 9-133379 that Tmin be prevented from occurring more frequently than a prescribed number of times. The conversion table for RLL (1–7) codes for use in this proposed method is, for example, the following Table 2.

TABLE 2

RML (1, 7; 2, 3; 3)

| | Data | Codes |
|---|---|---|
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |
| i = 3 | 100110 | 100 000 010 |

Symbol x used in this conversion table is "1" when the next channel bit is "0" and is "0" when the next channel bit is "1". The maximum constraint length r is 2.

In the conversion achieved by using Table 2, the next four data items are referred to when the data row becomes "10", and a code "100 000 010" for preventing the repitition of the minimum run d is given when the data row of six bits becomes "100110". The minimum run d may be repeated six times at most in the code obtained by this conversion.

To record data on a recording medium or transmit data in a specific way, the data is modulated into codes that can be recorded on the medium or transmitted in that specific way. The modulated codes may contain a direct-current component. If so, various error signals, such as the tracking error signal for the servo control in a disk drive, are likely to change or contain jitter. Therefore, the modulated codes should not better contain a direct-current component.

The variable-length RLL codes mentioned above, in which the minimum run d is 1 (d=1) and the conversion rates m and n are 2 and 3 (m=2, n 3), are not subjected to DSV (Digital Sum Value) control. In the DSV control, the absolute value of the total sum (DSV) of codes is decreased, when the train of channel bits is subjected to the NRZI modulation (that is, converted to level codes), and the "1" bits of the train (data symbols), i.e., +1 codes, are added, whereas the "0" bits of the train, i.e., −1 codes, are added. The DSV can serve to estimate the direct-current component in the train of codes. To decrease the absolute value of the DSV is to reduce the direct-current component in the train of codes.

In most cases, 2×(d+1) bits are used as DSV control bits. If d=1, four bits, i.e., 2×(1+1) bits, will be used as DSV bits. In this case, the minimum run and the maximum run can be maintained, and perfect DSV control can be achieved to invert codes and not to invert codes at any given intervals.

However, the DSV control bits are basically redundant bits. It is there desirable that the DSV control bits be reduced in number as much as possible in view of the efficiency of inverting codes.

Alternatively, 1×(d+1) bits may be used as DSV control bits. If so, two DSV bits, i.e., 1×(1+1) bits, will be used. In this case, too, perfect DSV control can be accomplished to invert codes and not to invert codes at any given intervals. Nonetheless, the maximum run increases to (k+2), though the minimum run can be maintained. The minimum run must be preserved by all means as a recorded code, but the maximum run need not be preserved as such. In some cases, there are formats in which a pattern breaking the maximum run is used as a sync signal. (EFM plus of DVD has a maximum run of 11T, which may increase to 14T to use a specific format.)

A table of 1,7PP (Parity preserve Prohibit rmtr) codes is available as a table that can achieve DSV control more efficiently, while preserving the basic function of the RML codes shown in Table 2. The 1,7PP codes are modulated codes, wherein the minimum run is 1 (d=1) and the maximum run is 7 (k=7). In each 1,7PP code, the minimum run is prohibited from repeating itself and rule is imparted to the elements that correspond to data words and code words.

The conversion table for 1,7PP codes, which the applicant hereof proposes in Japanese Patent Application No. 10-150280, is, for example, the following Table.

TABLE 3

1, 7PP (1, 7; 2, 3; 4)

| Data | Code |
|---|---|
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| "110111 | 001 000 000(next 010) |
| 00001000 | 000 100 100 100 |
| 00000000 | 010 100 100 100 | if xx1 then *0* = 000
xx0 then *0* = 101
"110111 001 000 000(next 010):
When next channel bits are '010',
convert '11 01 11' to '001 000 000' after
using main table and termination table.

In Table 3, the minimum run is 1 (d=1) and the maximum run is 7 (k=7). Among the elements sown in this conversion table are uncertain codes. An uncertain code is either "000" or "101" if two bits of the data row to be converted are (11), depending upon the code word train that immediately precedes the data row. If one channel bit of the immediately preceding code word train is "1", the two bits (11) will be converted to "000" to preserve the minimum run. If one channel bit of the immediately preceding code word train is "0", the two bits will be converted to "101" to preserve the maximum run.

The conversion table of Table 3 is one having a variable-length structure. That is, a code to be converted at the constraint length i=1 is composed of three data items, less than the four data items required [2^(m×i)=2^(2×1)=4]. Namely, among the data rows to be converted is a data row that cannot be converted at the constraint length i. After all, the constraint length i=3 must be applied to use Table 3 as a conversion table, or to convert all data rows.

The conversion table of Table 3 contains replacement codes that restrict the number of times the minimum run is repeated. Data row (110 111), or example, is replaced by "001 000 000" if the code word train that follows it is "010". If the code word train is other than "010", the data row will be converted to "*0*010*0*". The code word train obtained after the data conversion is limited in terms of the number of times the minimum run is repeated. The minimum run can be repeated six times at most.

The conversion table of Table 3 is based on the conversion rule that when the number of "1s" in the elements of a data row and the number of "1s" in a code word train to be converted are divided by 2, the remainders are the same, either "1" or "0". For example, the elements (000 001) of a data row corresponds to a code word train "010 100 100". The data row has one "1", whereas the code word train has three "1s". When the number of "1s" in the data row and the number of "1s" in the code word train are divided by 2, they have the same remainder, i.e., "1". Let us consider another example, The elements (000 000) of a data row corresponds to a code word train "010 100 000". The data row has no "1", whereas the code word train has two "1s". When the number of "1s" in the data row and the number of "1s" in the code word train are divided by 2, they have the same remainder, i.e., "0".

In the conversion table of Table 3, the maximum constraint length r is 4 (r=4). The conversion code, in which i=4, has a replacement code to achieve the maximum run k of 7 (k=7).

A data row can be modulated in accordance with the conversion table of Table 3, thereby to perform DSV control on the train of channel bits at prescribed intervals as has been practiced hither to. Nonetheless, the relation between the data row and the train of converted code words may be utilized to accomplish the DVS control at high efficiency.

As mentioned above, the conversion table may be one based on the conversion rule that when the number of "1s" in the elements of a data row and the number of s in a code word train to be converted are divided by 2, the remainders are the same, either "1" or "0". If so, inserting a DSV control bit "1" indicating "conversion" or a DSV control bit "0" indicating "non-conversion" in the train of channel bits is equivalent to inserting a DVS control bit "1" in a data bit train to convert the data bit train or a DVS control bit "0" the data bit train not to convert the data bit train.

Assume that three bits "001" need to be converted in Table 3. To insert a DSV control bit at the end of this bit train, the data conversion is represented as (001–x), where x is one bit, either 0 or 1. If x is "0", the conversion table of Table 3 will change to the following:

| Data | Codes |
| --- | --- |
| 0010 | 010 000 |

If x is "1", the conversion table of Table 3 will change to the following:

| Data | Codes |
| --- | --- |
| 0011 | 010 100 |

The code word train may be subjected to NRZI modulation. Then, the following level codes will be obtained:

| Data | Codes | Level Codes |
| --- | --- | --- |
| 0010 | 010 000 | 011111 |
| 0011 | 010 100 | 011000 |

Obviously, the last three bits of each level code are inverse to the last three bits of the other level code. This means that DSV control can be performed on the data row by selecting either "1" or "0" for the DSV control bit x.

In view of the redundancy due to the DSV control, to perform DSV control on one bit is to perform this control on 1.5 bit. This is because in Table 3, the conversion rates m and n are 2 and 3 (m=2, n=3) in the train of channel bits. To effect DSV control in a RLL (107) table such as Table 1 is to perform the DSV control in-the-train of channel bits. In order to preserve the minimum run, at least two channel bits are required as indicated above. The redundancy therefore increases.

In the conversion table of Table 3, DSV control can be carried out in a data row. The DSV control can therefore be effected efficiently. Furthermore, since the repetition of the minimum run is restricted, it is possible to generated codes that can be recorded and reproduced at high density.

To utilize the conversion table of Table 3 in practice, a sync signal must be used to identify the start of the data before the train of codes are reproduced. It is desired that the sync signal have a pattern that distinguishes the sync signal from any other signal. A plurality of sync signals must be used in some cases. If so, it is desired that the sync signals have such patterns that they may be distinguished from one another.

As described above, in order to record data on and reproduce data from a recording medium, such as a magnetic disk, a magneto-optical disk or an optical disk, at high density, it is necessary to select, as a modulated code, a code having the minimum run of 1 (d=1), to minimize the distortion of data at the time of recording and reproducing the data, thereby to inhibit generation of errors, and to use an appropriate sync signal when 1,7PP codes are selected as one suitable for high-density recording and reproduction of data.

DISCLOSURE OF INVENTION

The present invention has been made in view of the foregoing. The object of the invention is to provide a more reliably pattern for a sync signal.

The data-modulating apparatus according to the invention comprises sync signal adding means for adding a sync signal to a train of codes after adding a minimum run, said sync signal having a pattern that breaks a maximum run.

The data-modulating method according to the invention includes the step of adding a sync signal to a train of codes after adding a minimum run, said sync signal having a pattern that breaks a maximum run.

The data-providing medium according to the invention provides a computer-readable program, which causes a data-modulating apparatus to perform a process including the step of adding a sync signal to a train of codes after adding a minimum run, said sync signal having a pattern that breaks a maximum run.

The data-demodulating apparatus according to the invention comprises sync signal detecting means for detecting, from a train of codes, a sync signal having a pattern that breaks a maximum run, after detecting a minimum run.

The data-demodulating method according to this invention includes the step of detecting, from a train of codes, a sync signal having a pattern that breaks a maximum run, after detecting a minimum run.

The data-providing medium according to the invention provides a computer-readable program, which causes a data-demodulating apparatus to perform a process including the step of detecting, from a train of codes, a sync signal having a pattern that breaks a maximum run, after detecting a minimum run.

In the data-modulating apparatus, data-modulating method and data-providing medium according to the present invention, a sync signal having a pattern that breaks a maximum run is added to a train of codes, after adding a minimum run.

In the data-demodulating apparatus, data-demodulating method and data-providing medium according to the present invention, a sync signal having a pattern that breaks a maximum run is detected from a train of codes, after detecting a minimum run has been detected.

BEST MODE FOR CARRYING OUT THE INVENTION

Figure 1:
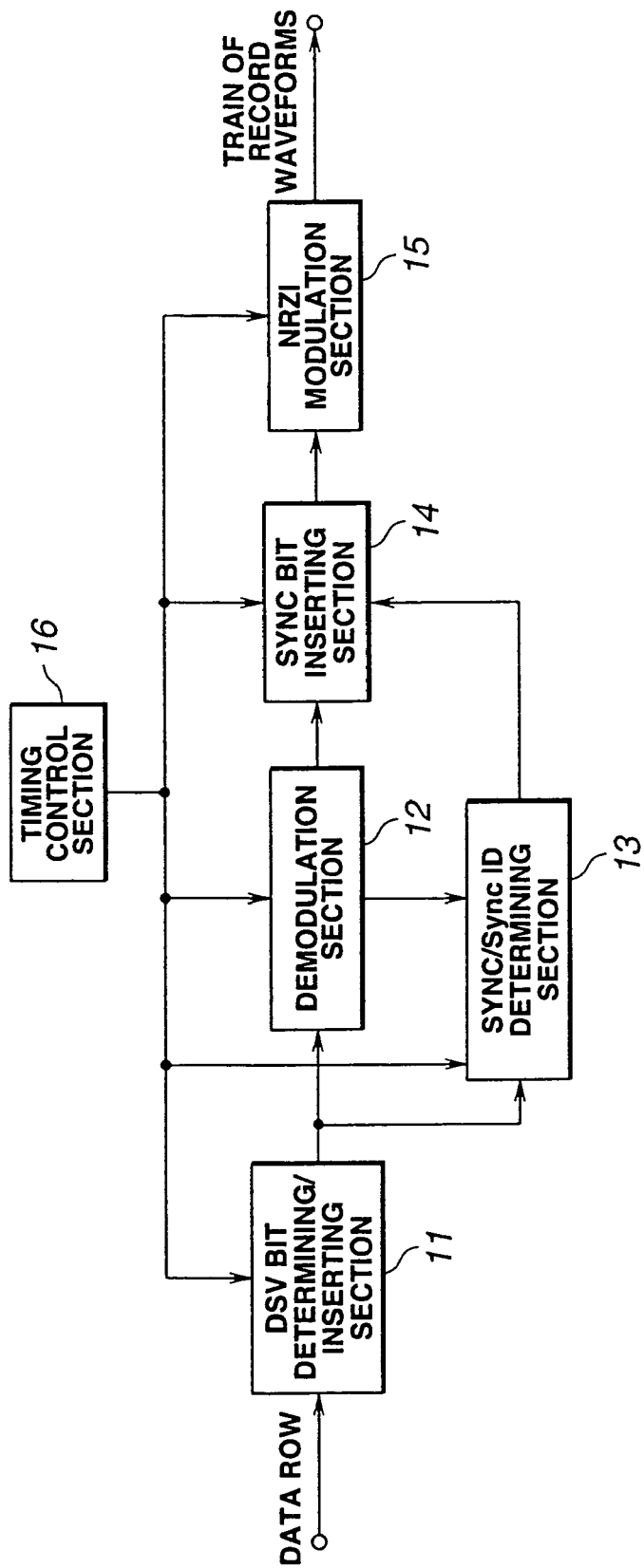
FIG. 1 is a block diagram showing a data-modulating apparatus according to one embodiment of the present invention.

Embodiments of this invention will now be described In order to clarify which means described any claim corresponds to which component used in each embodiment, the reference numeral designating the means is written in parentheses right after the component described. Nonetheless, the reference numeral thus used does not limit the means to that component.

The data-modulating apparatus according to this invention comprises sync signal adding means (e.g., SYNC bit inserting section 14 shown in FIG. 1) that is designed to add a sync signal to the minimum run contained in a train of codes. The sync signal has a pattern that breaks the maximum run.

The data-demodulating apparatus according to the invention comprises a sync signal detecting means (e.g., SYNC/Sync ID identification section 33) that is designed to detect a sync signal from the train of codes after detecting the minimum run. This sync signal has a pattern that breaks the maximum run.

The patterns of the sync signals shown in Table 3 have the following features, as is shown in Table 4.

(1) (Tmax+1)-(Tmax+1), thus giving 9T-9T. A pattern breaking the maximum run is continuously generated twice, thereby increasing the detection ability.

(2) Value 2T is applied before giving 9T-9T, thus preventing the generation of Tmax, whichever data row has been modulated. In other words, a short run is inserted so that no pattern of 8T-9T-9T may appear in the combination of the modulated data row and the data item immediately preceding the sync signal to be inserted. Assume that pattern of 8T-9T-9T appears. In this case, the detection distance between the first half of this pattern, i.e., 8T-9T, and the detected pattern 9T-9T will be 1, increasing the possibility that the detection ability decreases to make detection errors. To prevent this, 2T is inserted. Alternatively, 3T or 4T may be inserted before the 9T-9T for the same purpose. If 3T or 4T is inserted, however, the redundancy will increase. Thus, the highest efficiency is achieved when 2T is inserted.

(3) Two bits are arranged before 2T-9T-9T and used as connection bits. This makes it possible to insert a sync signal at any desired position and to terminate the data at the position where the sync signal is inserted.,

TABLE 4

Sync & Termination

01 010 000 000 010 000 000 010 (23 + 1 channel bits)
# = 0 not terminate case
# = 1 terminate case
Termination table
00     000
0000   010 100

Assume the conversion table of Table 3 generates a train of code words (i.e., a train of channel bits). To insert a sync signal at a desired position in the train of code words, a termination table may be used, if necessary, to terminate, at the desired position, a code that has been generated by the conversion table of Table 3 and that is a code having a variable length.

In the case of Table 3, to insert a sync signal at any desired position, a connection pattern is added at the junction of any two adjacent trains of code words to preserve both the minimum run d and the maximum run d. A sync signal pattern is inserted between two adjacent trains of code words. (The connection pattern may be regarded as a part of the sync signal pattern.) The sync signal pattern thus inserted or given consists of 24 bits, which can be divided by the conversion rates, m=2 and n=3, leaving no remainders. More precisely, the sync signal pattern is: "#01 010 000 000 010 000 000 010". The first bit # is the connection bit, which is either "0" or "1". The second channel bit is "0" to preserve the minimum run. The third and fourth channel bits define 2T. From the fifth channel bit et seq. define two continuous 9Ts, which is used as the sync signal pattern wherein k=8. That is, eight "0s" continuously appear between "1" and "1". This pattern is repeated twice. The last channel bit of this sync signal pattern, "1", is determines the maximum run. The last bit of the sync signal pattern is a connection bit of "0". The last bit serves to preserve the minimum run, d=1, no matter whichever bit follows this bit.

The termination table and the connection bit # in the sync signal pattern will be described. The termination table is as follows, as shown in Table 4;

00 000
0000 010 100

The termination table must be used when less than four conversion codes, which are not replacement codes for limiting the continuation of the minimum runs define the constraint length. As seen from Table 3, there are three conversion codes when the constrain length is 1, i=1. Hence, the termination table must be used. If the constraint length is 2, i=2, too, there are three conversion codes and the termination table must be used. If the constraint length is 3, i=3, there are five codes, of which one is a replacement code and the remaining four are conversion codes. Since there are required number of codes, termination is performed. If the constraint length is 4, i=4, the conversion codes are all replacement codes and it is unnecessary to taken termination into consideration. Hence, (00), i.e., the constraint length i=1 and (0000), i.e., the constrain length i=2, are given to the termination table.

The connection bit "#" of the sync signal is given to distinguish the case where a termination is used from the case where no termination table is used. To be more specific, the first channel bit "#" of the sync signal pattern is "1" when a termination code is used. Otherwise, this bit is "0". Thus, the connection bit "#" can reliably distinguish the case where a termination table is used from the case where no termination table is used, at the time of demodulating codes.

The sync signal pattern is defined by (23+1) channel bits and can therefore be reliably detected. In the case where two or more types of sync signals are required, (23+1) channel bits are insufficient to provide these types of sync signals.

Thus, six bits may be added to the above-mentioned 24 channel bits, whereby 30 channel bits are used, generating sync signals of various types. The various types of sync signals will be described below.

The sync signal patterns of two or more types, shown in the conversion tables of Tables 3 and 4, are defined as shown in Table 5. In each sync signal pattern, the minimum run is preserved and the minimum run cannot be repeated more than six times as shown in Table 3. Each sync signal pattern is so selected that the maximum run will not be generated outside the sync signal detection pattern. These sync signal patterns are connected to a data row in the same way as is indicated in Table 4.

TABLE 5

30 channel - bit Syncs

01 010 000 000 010 000 000 010 000 001
01 010 000 000 010 000 000 010 000 010
01 010 000 000 010 000 000 010 000 100
01 010 000 000 010 000 000 010 001 000
01 010 000 000 010 000 000 010 001 001
01 010 000 000 010 000 000 010 001 010
01 010 000 000 010 000 000 010 010 000
01 010 000 000 010 000 000 010 010 001
01 010 000 000 010 000 000 010 010 010
01 010 000 000 010 000 000 010 010 100
01 010 000 000 010 000 000 010 100 001
01 010 000 000 010 000 000 010 100 010
01 010 000 000 010 000 000 010 100 100
01 010 000 000 010 000 000 010 101 000
01 010 000 000 010 000 000 010 101 001
# = 0 not terminate case
# = 1 terminate case
Termination table
00    000
0000   010 100

As shown in Table 5, if 30 bits are used as sync signal bits, 15 types of sync signal patterns will be provided in accordance with various rules. From these sync signal patterns, the following various sync signal patterns can be determined as will be explained below.

Namely, seven signal patterns can be selected, any adjacent two of which are spaced apart by a distance of 2 or more.

TABLE 6

30 channel - bit Syncs

01 010 000 000 010 000 000 010 000 001
01 010 000 000 010 000 000 010 000 100
01 010 000 000 010 000 000 010 001 001
01 010 000 000 010 000 000 010 010 000
01 010 000 000 010 000 000 010 010 010
01 010 000 000 010 000 000 010 100 001
01 010 000 000 010 000 000 010 101 000
# = 0 not terminate case
# = 1 treminate case
Termination table
00    000
0000   010 100

The "distance of 2 or more" means that the two sync signal patterns differ from each other at two or more bits when the sync signal patterns are detected (the data reproduced is a level code). The sync signal patterns shown in Table 6 are those selected to satisfy this condition at the last six bits. The patterns shown in Table 6 are effective when many types of sync signals are required.

The following three sync signal patterns can be selected as DC-free sync signal patterns.

TABLE 7

30 channel - bit Syncs

01 010 000 000 010 000 000 010 001 000
01 010 000 000 010 000 000 010 010 001
01 010 000 000 010 000 000 010 100 010
# = 0 not terminate case
# = 1 terminate case
Termination table
00    000
0000   010 100

The word "DC-free" means that 30 channel bits of the sync signal pattern has a DSV value of zero. The sync signal patterns shown in Table 7 are DC-free and each spaced apart from the adjacent one by a distance of 2 or more.

The following three sync signal patterns can be selected to form a set, wherein the last bit of each sync signal pattern can be either "0" or "1".

TABLE 8

30 channel - bit Syncs

01 010 000 000 010 000 000 010 001 00x
01 010 000 000 010 000 000 010 010 00x
01 010 000 000 010 000 000 010 101 00x
x: 0 or 1
# = 0 not terminate case
# = 1 terminate case
Termination table
00    000
000   010 100

In the set of sync signal patterns, wherein the last bit of each sync signal pattern can be either "0" or "1", the last channel bit of each pattern serves to perform DC control on the next data row converted. Efficient DSV control can be achieved in the sync signal part. The data-modulating apparatus effects the DSV control by selecting "1" or "0" for the last bit of each sync signal pattern of Table 8, in accordance with the DSV value of the following data row. The three types of sync signal patterns are determined, regardless of the value of the last bit of the pattern.

An embodiment of the data-modulating apparatus according to the present invention will be described with reference to the accompanying drawing. This embodiment is a data-modulating apparatus that converts a data row to a variable-length code (d,k; m,n; r)=(1,7; 2,3; 4).

FIG. 1 is a block diagram showing a data-modulating apparatus according to one embodiment of the present invention, which inserts sync signals at prescribed intervals. The DSV bit determining/inserting section 11 performs DSV control on a data row at a given intervals, determines a DSV control bit "1" or "0", and inserts the DSV control bit at the prescribed intervals. The data row is supplied to a modulation section 12 and a SYNC/Sync ID determining section 13. The modulation section 12 modulates the data row having the DSV control bits inserted, generating a train of codes. The train of codes is output to a SYNC bit inserting section 14. The SYNC/Sync ID determining section 13 determines the pattern of the sync signals inserted into the data row at the prescribed intervals. The data representing the pattern, thus determined, is supplied to SYNC bit inserting section 14.

The SYNC bit inserting section 14 inserts the sync signals determined by the SYNC/Sync ID determining section 13, into the train of codes input from the modulation section 12.

The train of codes, now containing the sync signals, is supplied to an NRZI modulation section 15. The NRZI modulation section 15 performs NRZI modulation on the train of codes supplied from the SYNC bit inserting section 14, converting the same to a train of record waveforms. That is, the NRZI modulation section 15 outputs a train of record waveforms. The timing control section 16 generates a timing signal. The timing signal is supplied to the DSV bit determining/inserting section 11, modulation section 12, SYNC/Sync ID determining section 13, SYNC bit inserting section 14 and NRZI modulation section 15, thus controlling the operation timing of these sections.

The SYNC/Sync ID determining section 13 sets the first 24 codes of the 30-code word, i.e., the sync signal pattern of Table 3, to "x01 010 000 000 010 000 000 010." "x" is determined, depending on the train of converted codes that immediately precedes the sync signal inserted. If the immediately preceding data conversion has been effected by the use of a termination table, "x" is set to "1" (x=1). Otherwise, "x" is set to "0" (x=0). That is, "x" is equivalent to a sync signal inserted and has such a value as to preserve both the minimum run and the maximum run.

The SYNC bit inserting section 14 inserts the sync signal into the train of codes, said sync signal being one SYNC/Sync ID determining section 13 has determined as mentioned above. After the sync signal has been inserted into the train of codes, the process starts at the head of the conversion table.

The operation of the present embodiment will be explained.

DSV control is performed on the data row at the prescribed intervals, and sync signals are inserted into the data row at the prescribed intervals. The DSV bit determining/inserting section 11 accumulates the DSV values up to a certain position and calculates a DSV value for the next interval. Then, the section 11 selects a DSV control bit of "1" or "0" that makes smaller the sum of the accumulated DSV value and the DSV value for the next interval. The section 11 inserts the DSV control bit, thus selected, into the data row. The DSV value cannot be determined from the data row only. Thus, the DSV bit determining/inserting section 11 uses the conversion table, generating a train of code words from the data row. The section 11 finds the DSV value on the basis of the train of code words.

The bit train having the DSV value inserted is modulated (or converted) by the modulation section 12 on the basis of the conversion table. The modulation section 12 stores data representing the intervals of sync signals; it modulates the bit train up to a bit close to a sync signal. If the bit train cannot be converted by the use of the ordinary conversion table, that is, if the termination table of Table 4 must be used, the data showing this fact is output to the SYNC/Sync ID determining section 13.

The SYNC/Sync ID determining section 13 stores data representing the intervals of sync signals and determines the value of the first bit of the sync signal, i.e., the connection bit, from the condition existing before the sync signal was inserted. If the bit train is converted by the use of the ordinary conversion table, the connection b it is set to "0". If the bit train cannot be converted by using the ordinary conversion table and the termination table must therefore be used, the SYNC/Sync ID determining section 13 will refer the termination table, setting the first bit of the sync signal, i.e., the connection bit, to "1".

Thus, the first 24 bits of the sync signal are determined. The remaining six bits are set to values and used as Sync ID bits of the sync signal. The Sync ID bits may take one of seven sync signal patterns shown in, for example, Table 6. In each of these sync signal patterns, any adjacent two bits are spaced apart by a distance of 2.

The sync signals are determined as described above. The SYNC bit inserting section 14 inserts the sync signals into the train of codes. The sync signals may be determined by the use of the termination table stored in the SYNC/Sync ID determining section 13. In this case, the sync signals, each containing the value obtained from the termination table, are inserted into the train of codes by means of the SYNC bit inserting section 14.

Finally, the NRZI modulation section 15 converts the train of channel bits that has been DSV-controlled and that contains sync signals, into a record code.

Figure 2:
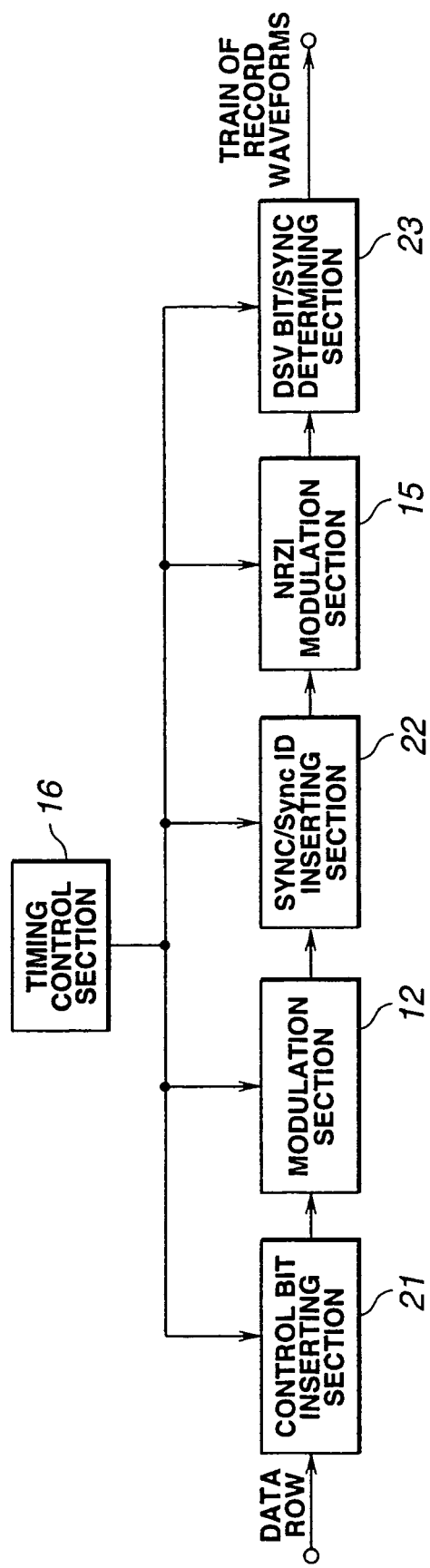
FIG. 2 is a block diagram showing another embodiment of the present invention.

FIG. 2 is a block diagram illustrating another embodiment of the present invention. As already explained in conjunction with the first embodiment, modulation and NRZI modulation must be performed in order to calculate a DSV value. Since each sync signal must be subjected to DSV control and, thus, to NRZI modulation. In view of this, the data-modulating apparatus may be designed as is shown in FIG. 2.

In the data-modulating apparatus of FIG. 2, the control bit inserting section 21 inserts a DSV control bit for every prescribed number of bits in the data row. The data row, now containing the DSV control bits, is supplied to the modulation section 12. The bits of this prescribed number include sync signals. Hence, the control bit inserting section 21 need not insert only one specific number of bits (rather, it may insert two or more specific numbers of bits). The modulation section 12 converts the data row supplied from the control bit inserting section 21, generating a train of channel bits. If the data row cannot be converted immediately before a sync signal in the modulation section 12, the section 12 will output a signal to a SYNC/Sync ID inserting section 22, instructing that the termination table be used.

The SYNC/Sync ID inserting section 22 inserts a sync signal in to the modulated code word at prescribed intervals. The SYNC/Sync ID inserting section 22 has a termination table. Whenever necessary, the section 22 uses the termination table, performing modulation and inserting 30 bits of the sync signal pattern into the train of channel bits. The train of code words, containing the sync signal and the DSV control bit, is converted to level codes by the NRZI modulation section 15. A DSV bit/SYNC determining section 23 calculates a DSV value from the train of level codes supplied to it. At the same time, the section 23 determines the pattern of the sync signal. The output of the DSV bit/SYNC determining section 23 is a train of record codes and identical to the output of the data-modulating apparatus shown in FIG. 1. The timing control section 16 generates a timing signal. The timing signal is supplied to the control bit inserting section 21, modulation section 12, SYNC/Sync ID inserting section 22, NRZI modulation section 15 and DSV bit/SYNC determining section 23. The timing signal controls the operation timing of these sections.

Next, the operation of the data-modulating apparatus of FIG. 2 will be explained. The control bit inserting section 21 generates two trains of bits from the input data row. In the first train of bits, DSV control bits "1" are inserted at predetermined intervals. In the second train of bits, DSV control bits are inserted at predetermined intervals. These train of bits are modulated by the modulation section 12. The SYNC/Sync ID inserting section 22 inserts sync signals in the signals modulated by the modulation section 12. The SYNC/Sync ID inserting section 22 incorporates a termination table and converts the data row terminated to insert sync signals, to a train of code words. The train of code words is converted to level codes by the NRZI modulation section 15. At this time, no DSV control bits are determined in the train of channel bits, and two types of level code trains exist. The DSV bit/SYNC determining section 23 calculates the DSV value of each train of level codes and selects and determines that train of channel bits which inhibits the accumulated DSV values. It is at this time that the pattern of sync signals is determined. The train of code words (a train of channel bits), thus determined, is output as a data row that has been DSV-controlled.

Then, a data-demodulating apparatus, which is an embodiment of the present invention, will be described with reference to the accompanying drawing. This embodiment is a data-demodulating apparatus that demodulates a data row modulated to a variable-length code (d, k; m, n; r)=(1,7;2, 3;4).

Figure 3:
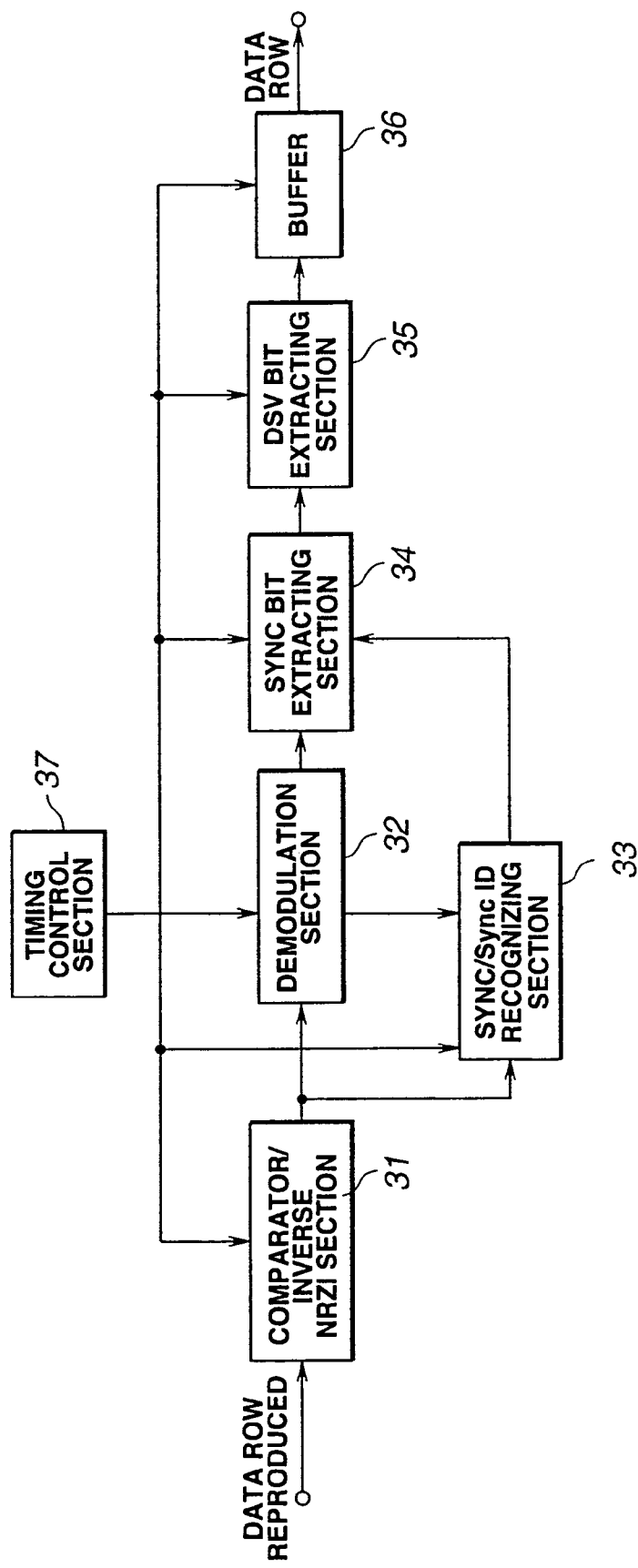
FIG. 3 is a block diagram showing a data-demodulating apparatus according to an embodiment of the invention.

FIG. 3 is a block diagram showing a data-demodulating apparatus for demodulating data reproduced and containing sync signals. A comparator/inverse NRZI section 31 compare the signals transmitted via a transmission path or the signals reproduced from a recording medium and performs inverse NRZI modulation on the signals (thereby, converting them to edge signals). The edge signals, or digital signals, are supplied to a demodulation section 32 and a SYNC/Sync ID recognizing section 33. The section 32 demodulates the digital signals in accordance with a demodulation table (i.e., inverse conversion table) and outputs the signals to a SYNC bit extracting section 34. The SYNC/Sync ID recognizing section 33 detects the sync signals (Sync) inserted at predetermined intervals. If an inverse conversion termination table, which is one of the termination tables, is used immediately before the sync signals detected, the section 33 supplies the data showing this fact, to the demodulation section 32. The SYNC/Sync ID recognizing section 33 recognizes a Sync ID on the basis of the last six bits of the sync signal. The SYNC bit extracting section 34 extracts the sync signal. A DSV bit extracting section 35 removes DSV control bits from the demodulated data row, which have been inserted at given intervals into the data row. Thus, the DSV bit extracting section 35 output the initial data row. A buffer 36 temporarily stores the serial data input from the DSV bit extracting section 35 and output the same at a prescribed transfer rate. A timing control section 37 generates a timing signal. The timing signal is supplied to the comparator/inverse NRZI section 31, demodulation section 32, SYNC/Sync ID recognizing section 33, SYNC bit extracting section 34, DSV bit extracting section 35 and buffer 36. The timing signal controls the operation timing of these components.

The SYNC/Sync ID recognizing section 33 determines the positions of sync signals from the pattern specific to the sync signals. Since the sync signals are inserted at prescribed intervals, the section 33 can determine their positions by counting the intervals. Once the positions of the sync signals are determined, demodulation is performed on not only on the data immediately before any sync signal but also on the termination table. No termination table is required immediately after any sync signal, and the data can be demodulated by the use of the ordinary conversion table of Table 3.

After the data has been demodulated immediately before the sync signal as described above, the SYNC bit extracting section 34 removes the bits of a prescribed sync signal. Therefore, the SYNC bit extracting section 34 is compatible with the demodulation section 32.

The operation of the data-demodulating apparatus will be explained.

The signals transmitted via the transmission path or the signals reproduced from the recording medium are input to the comparator/inverse NRZI section 31. The signals are compared and converted to inverse NRZI codes (codes in which indicates an edge). These codes, or digital signals, are supplied to the demodulation section 32 and the SYNC/Sync ID recognizing section 33.

The demodulation section 32 demodulates the digital signals in accordance with the inverse conversion table of Table 3. The demodulation section 32 has the inverse conversion table of Table 3, but need not have an inverse conversion table for termination. In this instance, the inverse conversion cannot be effected at a part immediately before any sync signal inserted. The SYNC/Sync ID recognizing section 33 performs the inverse conversion, nonetheless. The SYNC/Sync ID recognizing section 33 supplies the sync signals detected, to the demodulation section 32. The demodulation section 32 starts demodulating in synchronization with the sync signals.

The SYNC/Sync ID recognizing section 33 detects "x01 010 000 000 010 000 000 010" representing 2T-9T-9T, i.e., the sync signal pattern given. This sync signal pattern contains 9T that is a specific to the sync signal pattern. The sync signal pattern would not be detected from any other train of data code words. Once the SYNC/Sync ID recognizing section 33 has detected a sync signal pattern, the sync signals inserted at the prescribed intervals can be detected by means of an internal counter or the like.

The SYNC/Sync ID recognizing section 33 has an inverse conversion termination table, which is one of the termination tables. It demodulates the code words generated immediately before each sync signal, in accordance with the termination table. The results of the demodulation thus effected are supplied to the demodulation section 32. After all, it suffices to set an inverse conversion table in either the demodulation section 32 or the SYNC/Sync ID recognizing section 33.

The SYNC/Sync ID recognizing section 33 recognizes the two or more sync signals that follow the 2T-9T-9T, which is a sync signal pattern. A pattern that can be readily detected is selected for each sync signal.

The SYNC bit extracting section 34 removes 30 bits from each sync signal. Furthermore, the DSV bit extracting section 35 removes DSV control bits inserted at prescribed intervals.

An example of the inverse conversion table is shown in Table 9 presented below. An example of the terminal inverse converse table is shown in Table 10 presented below.

TABLE 9

Inverse Conversion Table
1, 7PP-(d, k; m, n; r) = (1, 7; 2, 3; 4) r = 4

| Train of Code Words | Demodulated Data Row |
| --- | --- |
| i = 1  101 | 11 |
| 000 | 11 |
| 001 | 10 |
| 010 | 01 |
| i = 2  010 100 | 0011 |
| 010 000(not 100) | 0010 |
| 000 100 | 0001 |
| i = 3  000 100 100 | 000011 |
| 000 100 000(not 100) | 000010 |
| 010 100 100 | 000001 |
| 010 100 000(not 100) | 000000 |

TABLE 9-continued

Inverse Conversion Table
1, 7PP-(d, k; m, n; r) = (1, 7; 2, 3; 4) r = 4

| Train of Code Words | Demodulated Data Row |
|---|---|
| i = 3: Prohibit Repeated Minimum Transition Run length | |
| 001 000 000(not 100) | 00001000 |
| i = 4: limits k to 7 | |
| 000 100 100 100 | 00001000 |
| 010 100 100 100 | 00000000 |

TABLE 10

Inverse Conversion Table
Termination table

| | |
|---|---|
| 000 | 00 |
| 010 100 | 0000 |

The minimum run, d=1, can be preserved by determining sync signals and inserted in the way described above. The number of times the minimum run can be repeated remains limited to six. No run greater than the maximum run, k=7, would be generated outside the sync signal. If 9T where k=8 is repeated twice continuously in the sync signal, the sync signal will be more readily detected. Such a sync signal as shown in Table 6 has seven types of sync signal IDs, and any adjacent two bits in it are spaced apart by a distance of 2. Thus, the IDs of this sync signal can be readily detected. Besides these characteristics, DSV control can be effected on the data bits, making it possible to perform DSV control with high efficiency.

The conversion table has variable-length replacement codes, each having the minimum run d of 1 (d=1), maximum run k of 7 (k=7), conversion rate m/n of ⅔, and each restricting the number of times the minimum run can be repeated. The conversion table is based on the rule that when the number of "1s" in the elements of the conversion table and the number of "1s" in a code word train to be converted are divided by 2, the remainders are the same, either "1" or "0". When a sync signal is inserted at a prescribed position in the conversion table, the sync signal will acquire a unique pattern, without changing the limited number of times the minimum run and the maximum ran can be repeated, and will be readily detected. Hence, the sync signal can be detected reliably in stability. Further, since the data row terminates, without fail, at any position where a sync signal is inserted, the data can be more easily controlled before and after the sync signal while being demodulated. This helps to accomplish stable demodulation of data.

The data-providing medium for providing the computer program for the above-described process may be a magnetic disk, a CD-ROM, a solid-state memory or the like. Moreover, the computer program may be provided by using a communication medium such as a network or a communications satellite.

INDUSTRIAL APPLICABILITY

In the data-modulating apparatus, data-modulating method and data-providing medium according to the present invention, a sync signal is added to a train of codes after adding the minimum run. The sync signal has a pattern that breaks the maximum run. That is, a reliable pattern is imparted to the sync signal.

In the data-demodulating apparatus, data-demodulating method and data-providing medium according to the present invention, a sync signal is detected from a train of codes after detecting the minimum run. The sync signal has a pattern that breaks the maximum run. Hence, a sync signal pattern can be reliably detected.

The invention claimed is:

1. A data-demodulating apparatus for demodulating a variable-length code (d, k; m, n; r) having a basic code length of n bits to data having a basic data length of m bits, said apparatus comprising:
   receiving means for receiving a train of codes; and
   sync signal detecting means for detecting, from said train of codes, a sync signal having a pattern that breaks a maximum run, after detecting a minimum run,
   wherein said pattern is repeated twice continuously,
   wherein said minimum run is repeated no more than six times, and
   wherein the first bit of the sync signal is "1" when the train of modulated codes that immediately precedes the sync signal is included in a termination table used to terminate, at a desired position, a code when less than a predetermined number of variable length codes are available
   wherein "d" is the minimum run,
   wherein "k" is the maximum run,
   wherein "r" is a maximum constraint length,
   and variables d, K, m, n and r are integers.

* * * * *